United States Patent
Shinozaki

(10) Patent No.: US 12,381,550 B2
(45) Date of Patent: Aug. 5, 2025

(54) GATE DRIVE CIRCUIT FOR SWITCHING CIRCUIT, MODULE INCLUDING THE SAME, AND SWITCHING POWER SUPPLY

(71) Applicant: ROHM CO., LTD., Kyoto (JP)

(72) Inventor: Yuichi Shinozaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 91 days.

(21) Appl. No.: 18/446,705

(22) Filed: Aug. 9, 2023

(65) Prior Publication Data
US 2024/0088888 A1    Mar. 14, 2024

(30) Foreign Application Priority Data
Sep. 9, 2022  (JP) .................. 2022-144125

(51) Int. Cl.
| | | |
|---|---|---|
| H03K 17/10 | (2006.01) | |
| H03K 17/06 | (2006.01) | |
| H03K 17/687 | (2006.01) | |

(52) U.S. Cl.
CPC ......... *H03K 17/102* (2013.01); *H03K 17/063* (2013.01); *H03K 17/687* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| | | | | |
|---|---|---|---|---|
| 7,940,092 B2 * | 5/2011 | Zheng | ............. | H03K 17/08122 |
| | | | | 327/423 |
| 2006/0087300 A1 * | 4/2006 | Endo | ............. | G05F 1/618 |
| | | | | 323/282 |
| 2020/0036380 A1 * | 1/2020 | Matsubara | ............. | H02M 1/08 |
| 2020/0044554 A1 | 2/2020 | Penzo et al. | | |
| 2020/0067502 A1 * | 2/2020 | Hiyama | ............. | H03K 17/163 |
| 2020/0235653 A1 * | 7/2020 | Kimura | ............. | H02M 7/53875 |
| 2021/0211126 A1 * | 7/2021 | Roig-Guitart | ............. | H02M 1/08 |
| 2023/0130625 A1 * | 4/2023 | Takubo | ............. | H03K 17/687 |
| | | | | 363/13 |

* cited by examiner

*Primary Examiner* — Kenneth B Wells
(74) *Attorney, Agent, or Firm* — CANTOR COLBURN LLP

(57) ABSTRACT

A gate drive circuit for a switching circuit including high-side and low-side transistors which are GaN-HEMTs (High Electron Mobility Transistors), includes: a high-side driver driving the high-side transistor; and a low-side driver driving the low-side transistor, wherein the low-side driver is configured to be capable of applying 0 V, a high-level voltage higher than a gate threshold voltage of the low-side transistor, and a bias voltage lower than the gate threshold voltage between a gate and a source of the low-side transistor, and the low-side driver is configured to apply the bias voltage between the gate and the source of the low-side transistor during a dead time inserted during transition from a high-level output state where the high-side transistor is turned on and the low-side transistor is turned off to a low-level output state where the high-side transistor is turned off and the low-side transistor is turned on.

10 Claims, 7 Drawing Sheets

(Reference Example)

GATE DRIVE CIRCUIT FOR SWITCHING CIRCUIT, MODULE INCLUDING THE SAME, AND SWITCHING POWER SUPPLY

CROSS-REFERENCE TO RELATED APPLICATION

The present invention claims priority under 35 U.S.C. § 119 priority from Japanese Patent Application No. 2022-144125, filed on Sep. 9, 2022, the entire contents of which are incorporated herein by reference.

TECHNICAL FIELD

The present disclosure relates to a switching circuit.

BACKGROUND

In the art relating to power electronics, including DC/DC converters, AC/DC converters, and inverters, switching circuits such as half-bridge circuits and full-bridge circuits are used.

FIG. 1 is a circuit diagram of a switching circuit 100R. The switching circuit 100R includes a high-side transistor MH and a low-side transistor ML that are connected in series, and a gate drive circuit 200R configured to drive them. The gate drive circuit 200R complementarily controls on/off of the high-side transistor MH and the low-side transistor ML, thereby switching a switching terminal SW between two states, that is, a high-level output state (input voltage $V_{IN}$) and a low-level output state (ground voltage 0 V).

The gate drive circuit 200R includes a high-side driver 202, a low-side driver 204, and a rectifying element D1. The high-side transistor MH is an N-channel transistor and requires a drive voltage higher than the input voltage $V_{IN}$ to turn on. A bootstrap circuit is used to generate the drive voltage higher than the input voltage $V_{IN}$. Together with an external bootstrap capacitor $C_B$, the rectifying element D1 constitutes the bootstrap circuit.

When the high-side transistor MH and the low-side transistor ML are turned on at the same time, a through-current flows. To prevent this, a dead time is inserted in which both the high-side transistor MH and the low-side transistor ML are turned off. In several applications, including DC/DC converters, a reverse current flows through the low-side transistor ML during the dead time when the switching circuit 100 transitions from a low output to a high output.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
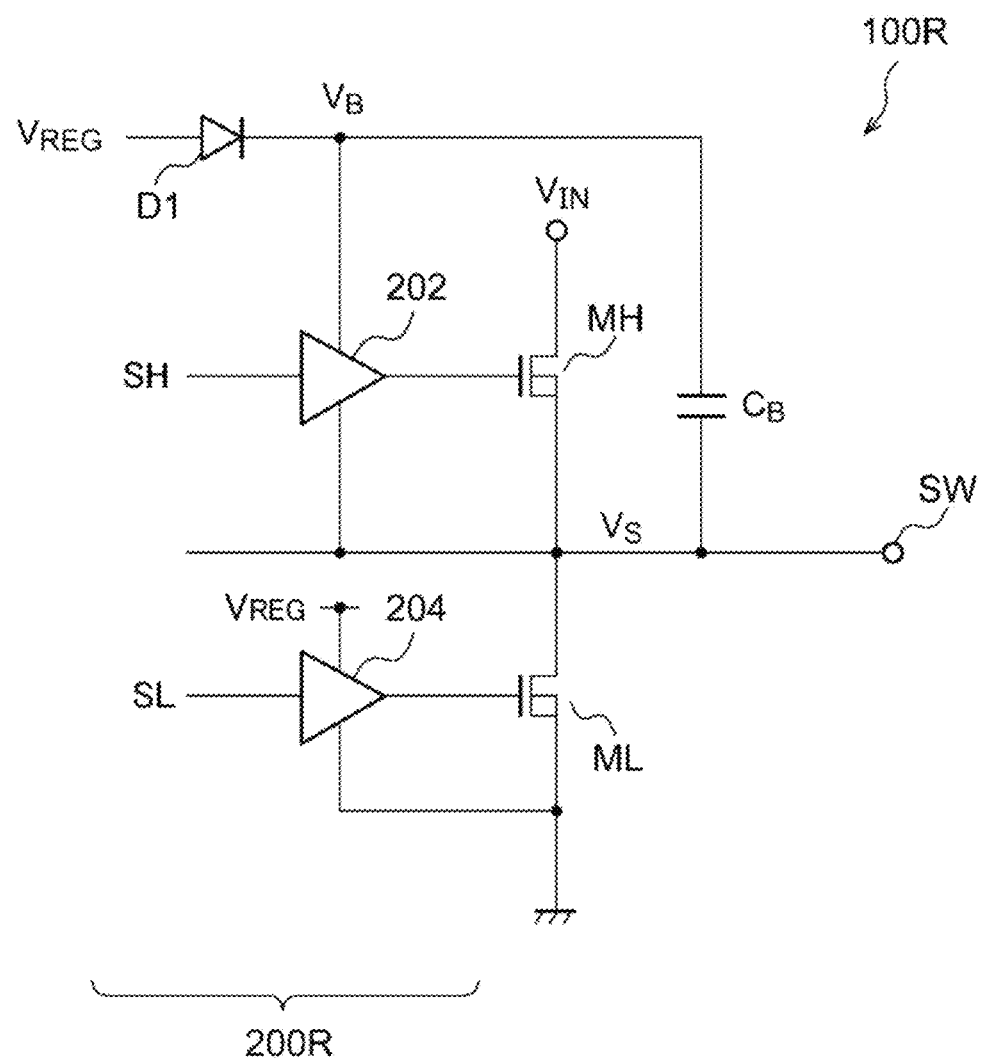
FIG. 1 is a circuit diagram of a switching circuit.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Overview of Embodiments

An overview of some exemplary embodiments of the present disclosure is described. This overview presents, in a simplified form, some concepts of one or more embodiments, as a prologue to the detailed description which will be presented later, and for the purpose of basic understanding of the embodiments, but it is not intended to limit the scope of the present disclosure. This overview is not a comprehensive overview of all possible embodiments, and it is intended to neither identify key elements of all embodiments nor delineate the scope of some or all aspects. For the sake of convenience, "an embodiment" may be used to refer to one embodiment (example or modification) or a plurality of embodiments (examples or modifications) disclosed herein.

A gate drive circuit according to an embodiment of the present disclosure is used for a switching circuit including a high-side transistor and a low-side transistor that are GaN-HEMTs (High Electron Mobility Transistors). The gate drive circuit includes a high-side driver configured to drive the high-side transistor, and a low-side driver configured to drive the low-side transistor. The low-side driver is configured to be capable of applying 0 V, a high-level voltage higher than a gate threshold voltage of the low-side transistor, and a bias voltage lower than the gate threshold voltage between a gate and a source of the low-side transistor, and the low-side driver applies the bias voltage between the gate and the source of the low-side transistor during a dead time inserted during transition from a high-level output state in which the high-side transistor is turned on and the low-side transistor is turned off to a low-level output state in which the high-side transistor is turned off and the low-side transistor is turned on.

A reverse voltage of the GaN-HEMT depends on a gate-source voltage, and the reverse voltage becomes smaller as the gate-source voltage becomes larger. Therefore, by applying the bias voltage that does not exceed the gate threshold voltage between the gate and the source of the low-side transistor during the dead time, it is possible to reduce the reverse voltage while maintaining the off-state of the low-side transistor, thereby reducing a loss.

In an embodiment of the present disclosure, the low-side driver may start applying the bias voltage before transition from the high-level output state to the dead time. As a result, it is possible to reduce the loss over the entire period of the dead time.

In an embodiment of the present disclosure, the low-side driver may include a pre-driver configured to apply a high-level voltage or a low-level voltage to the gate of the low-side transistor, a voltage source configured to generate a reference voltage that defines the bias voltage, and a switch connected between an output of the voltage source and the gate of the low-side transistor.

In an embodiment of the present disclosure, the voltage source may change the reference voltage according to a temperature.

In an embodiment of the present disclosure, a gate drive circuit may apply 0 V between the gate and the source of the low-side transistor during a dead time inserted during transition from the low-level output state to the high-level output state.

In an embodiment of the present disclosure, the high-side driver may be configured to be capable of applying 0 V, a high-level voltage higher than a gate threshold voltage of the high-side transistor, and a bias voltage lower than the gate threshold voltage between the gate and the source of the high-side transistor, and the high-side driver may apply the bias voltage between the gate and the source of the high-side transistor during a dead time inserted during transition from the low-level output state to the high-level output state.

In applications where a reverse current flows through the high-side transistor, it is possible to reduce the loss by applying the bias voltage to the high-side transistor during the dead time.

A gate drive circuit according to an embodiment of the present disclosure includes a high-side driver configured to drive a high-side transistor, and a low-side driver configured to drive a low-side transistor. The high-side driver is configured to be capable of applying 0 V, a high-level voltage higher than a gate threshold voltage of the high-side transistor, and a bias voltage lower than the gate threshold voltage between the gate and the source of the high-side transistor, and the high-side driver applies the bias voltage between the gate and the source of the high-side transistor during a dead time inserted during transition from a low-level output state in which the high-side transistor is turned off and the low-side transistor is turned on to a high-level output state in which the high-side transistor is turned on and the low-side transistor is turned off.

According to the above-described configuration, it is possible to reduce the loss of the high-side transistor during the dead time.

In an embodiment of the present disclosure, the gate drive circuit may be integrated on one semiconductor substrate. The term "integrated" is intended to include both a case where all elements of a circuit are formed on a semiconductor substrate and a case where main elements of a circuit are integrated on the semiconductor substrate. In addition, some resistors, capacitors, and the like for adjustment of a circuit constant may be provided outside the semiconductor substrate. By integrating the circuit on one chip, it is possible to reduce an area of the circuit and keep characteristics of circuit elements uniform.

A module according to an embodiment of the present disclosure may include any one of the gate drive circuits described above, a high-side transistor, and a low-side transistor.

A switching power supply according to an embodiment of the present disclosure may include a high-side transistor and a low-side transistor, and a gate drive circuit configured to drive the high-side transistor and the low-side transistor.

EMBODIMENTS

Embodiments of the present disclosure will now be described with reference to the drawings. Like or equivalent components, members, and processes illustrated in each drawing are given like reference numerals and a repeated description thereof will be omitted appropriately. Further, the embodiments are presented by way of example only and are not intended to limit the present disclosure, and any features or combination thereof described in the embodiments may not necessarily be essential to the present disclosure.

In the present disclosure, "a state where a member A is connected to a member B" includes a case where the member A and the member B are physically and directly connected or even a case where the member A and the member B are indirectly connected via any other member that does not substantially affect an electrical connection state between the members A and B or does not impair functions and effects achieved by combinations of the members A and B.

Similarly, "a state where a member C is connected (installed) between a member A and a member B" includes a case where the member A and the member C or the member B and the member C are indirectly connected via any other member that does not substantially affect an electrical connection state between the members A and C or the members B and C or does not impair function and effects achieved by combinations of the members A and C or the members B and C, in addition to a case where the member A and the member C or the member B and the member C are directly connected.

Further, in the present disclosure, symbols attached to electrical signals such as voltage signals and current signals, or circuit elements such as resistors, capacitors, inductors, etc., denote respective voltage values, current values, or circuit constants (resistance, capacitance, and inductance) if necessary.

First Embodiment

Figure 2:
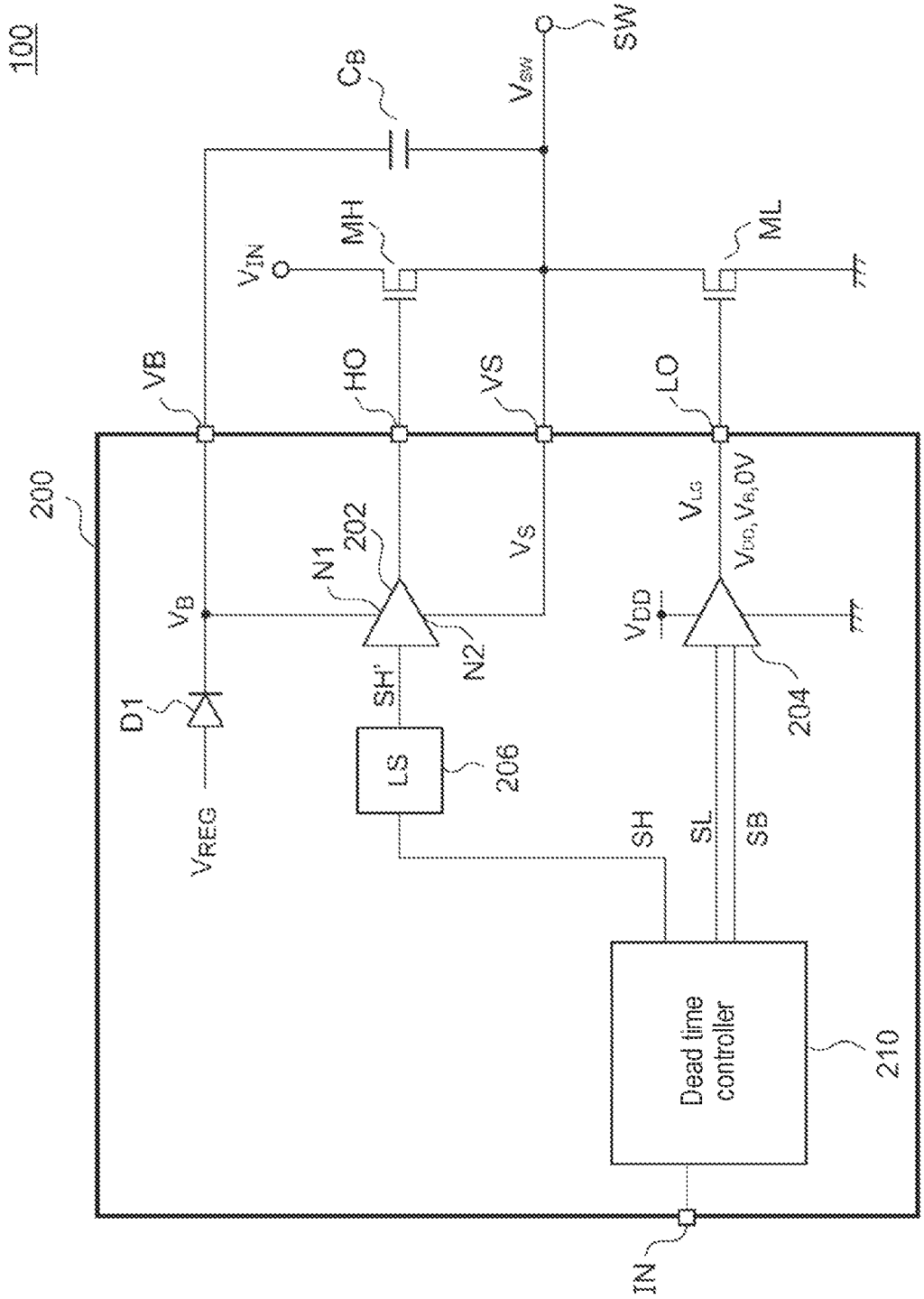
FIG. 2 is a block diagram of a switching circuit including a gate drive circuit according to a first embodiment of the present disclosure.

FIG. 2 is a block diagram of a switching circuit 100 including a gate drive circuit 200 according to a first embodiment of the present disclosure. The switching circuit 100 includes a high-side transistor MH, a low-side transistor ML, a bootstrap capacitor $C_B$, and the gate drive circuit 200. The high-side transistor MH and the low-side transistor ML are GaN-HEMTs (GaN-FETs).

The gate drive circuit 200 receives a pulse input signal at its input pin (or terminal) IN and controls the high-side transistor MH and the low-side transistor ML according to an input signal IN. For example, when the input signal IN is at a high level, the high-side transistor MH is turned on, the low-side transistor ML is turned off, and a voltage $V_S$ of a switching terminal SW has a high level. When the input signal IN is at a low level, the high-side transistor MH is turned off, the low-side transistor ML is turned on, and the voltage $V_S$ of the switching terminal SW is at a low level.

The gate drive circuit 200 includes a high-side driver 202, a low-side driver 204, a level shifter 206, a dead time controller 210, and a diode D1, which are integrated on one semiconductor substrate.

An output pin HO of the gate drive circuit 200 is connected to the gate of the high-side transistor MH, and a switching pin $V_S$ thereof is connected to the source of the high-side transistor MH and the drain of the low-side transistor ML. An output pin LO of the gate drive circuit 200 is connected to the gate of the low-side transistor ML.

The dead time controller 210 generates two pulses, that is, a high-side pulse SH and a low-side pulse SL, which have a high level complementarily, based on the input signal IN.

A high-level section of the high-side pulse SH corresponds to a high-level section of the input signal IN, and a high-level section of the low-side pulse SL corresponds to a low-level section of the input signal IN. The dead time controller 210 inserts a dead time in which both the high-side pulse SH and the low-side pulse SL are turned off each time the level of the input signal IN changes such that the high-side transistor MH and the low-side transistor ML are not turned on at the same time.

The low-side driver 204 drives the low-side transistor ML based on the low-side pulse SL. The high-side pulse SH is input to the high-side driver 202 via the level shifter 206. When the low-side pulse SL is at a first level (for example, high level), the low-side driver 204 applies a high-level voltage ($V_{DD}$) higher than a gate threshold voltage Vgs(th) of the GaN-HEMT between the gate and the source of the low-side transistor ML. Further, when the low-side pulse SL is at a second level (for example, low level), the low-side driver 204 applies 0 V between the gate and the source of the low-side transistor ML.

An upper power supply node N1 of the high-side driver 202 is connected to a bootstrap pin VB, and a lower power supply node N2 thereof is connected to the switching pin $V_S$, and the high-side transistor MH is driven based on a level-shifted high-side pulse SH'.

One end of the bootstrap capacitor $C_B$ is connected to the switching pin $V_S$, and the other end thereof is connected to the bootstrap pin VB. A cathode of the diode D1 is connected to the other end of the bootstrap capacitor $C_B$ via the VB pin, and a constant voltage $V_{REG}$ is applied to the anode of the diode D1.

The high-side driver 202 operates with a potential difference $V_{BS}=V_B-V_S$ between the bootstrap pin VB and the switching pin $V_S$, that is, a voltage across the bootstrap capacitor $C_B$, as a power supply voltage. Therefore, $V_{BS}$ is called a high-side power supply voltage.

When the high-side pulse SH' is at a first level (for example, high level), the high-side driver 202 applies a high-level voltage ($V_{BS}$) higher than the gate threshold voltage Vgs(th) of the GaN-HEMT between the gate and the source of the high-side transistor MH. Further, when the high-side pulse SH is at a second level (for example, low level), the high-side driver 202 applies 0 V between the gate and the source of the high-side transistor MH.

In the present embodiment, the low-side driver 204 is configured to be capable of applying a bias voltage $V_{BIAS}$ between the gate and the source of the low-side transistor ML in addition to a high-level voltage $V_{DD}$ and 0 V. The bias voltage $V_{BIAS}$ is set to be lower than the gate threshold voltage Vgs(th) of the low-side transistor ML. For example, the bias voltage $V_{BIAS}$ may be a voltage lower by about 0.1 to 0.2 V than Vgs(th).

The low-side driver 204 applies the bias voltage $V_{BIAS}$ between the gate and the source of the low-side transistor ML during the dead time inserted during the transition from a high-level output state to a low-level output state. The low-side driver 204 outputs the bias voltage $V_{BIAS}$ according to a control signal SB generated by the dead time controller 210.

The configuration of the gate drive circuit 200 is as described above. Next, an operation thereof will be explained.

Figure 3:
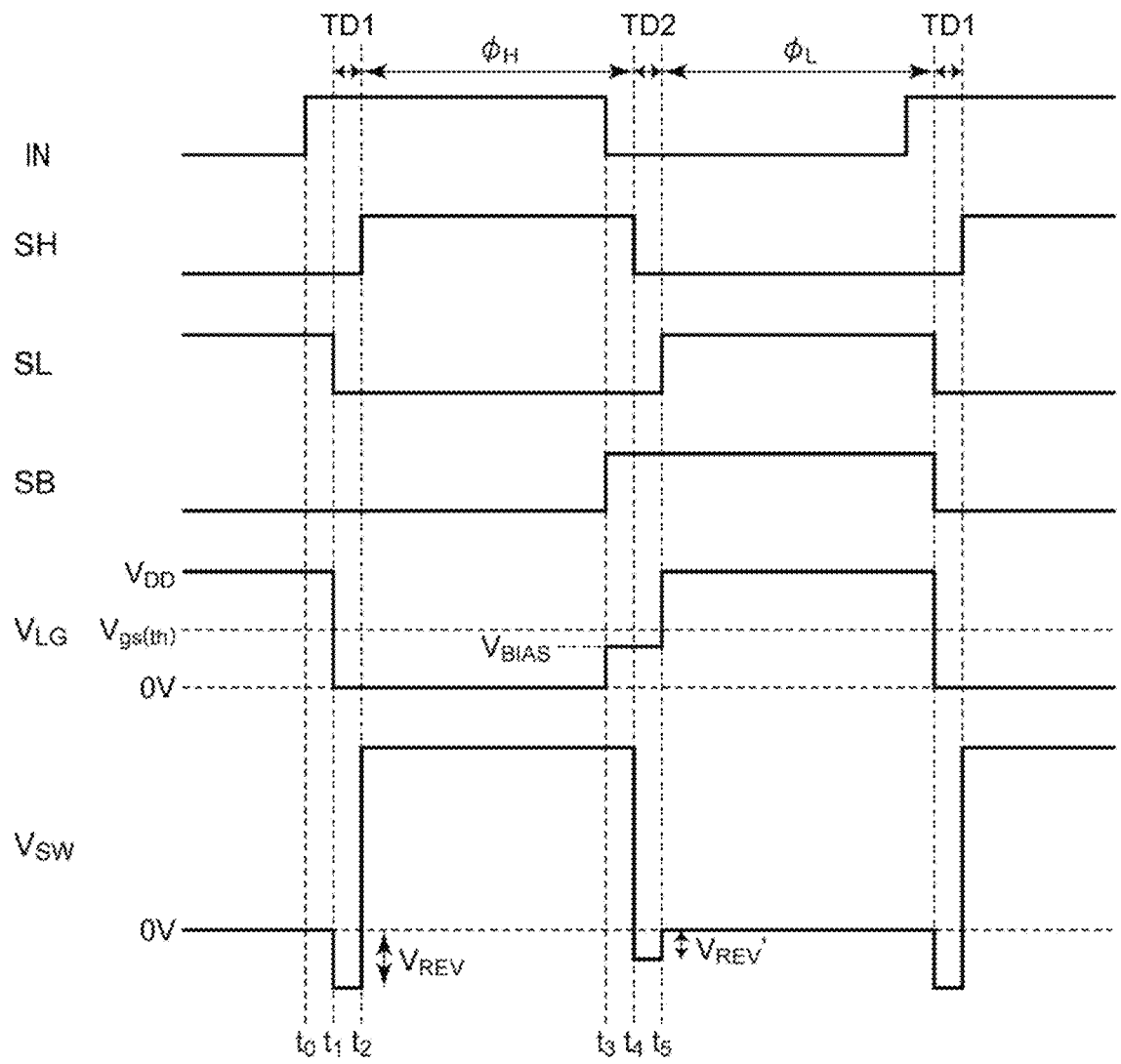
FIG. 3 is an operation waveform diagram of the gate drive circuit of FIG. 2.

FIG. 3 is an operation waveform diagram of the gate drive circuit 200 of FIG. 2.

The input signal IN alternately repeats between a high level and the low level. When the input signal IN transitions to a high level at time t0, this triggers the dead time controller 210 to transition the low-side pulse SL to a low level at time t1. At time t2 after the lapse of a dead time TD1, the high-side pulse SH transitions to a high level. During this dead time TD1, a switching voltage $V_{SW}$ becomes $-V_{REV}$. $V_{REV}$ is the reverse voltage of the low-side transistor ML.

At time t2, the high-side pulse SH has the high level, and the high-side transistor MH is turned on, resulting in a high-level output state $\varphi_H$.

At time t3, the input signal IN transitions to a low level. The low-side driver 204 starts applying the bias voltage $V_{BIAS}$ before the transition from the high-level output state $\varphi_H$ to the next dead time TD2, that is, during the high-level output state $\varphi_H$. For example, the dead time controller 210 is triggered by the transition of the input signal IN to the low level to immediately assert (for example, set to the high level) the control signal SB. At subsequent time t4, the dead time controller 210 causes the high-side pulse SH to transition to the low level. The bias voltage $V_{BIAS}$ is applied between the gate and the source of the low-side transistor ML during a period from time t4 to time t5.

Then, when the low-side pulse SL has the high level at time t5 after the lapse of the dead time TD2 from time t4, the high-level voltage $V_{DD}$ is applied between the gate and the source of the low-side transistor ML. As a result, the low-side transistor ML is turned on, resulting in a low-level output state $\varphi_L$.

The gate drive circuit 200 repeats this operation. The above is the operation of the gate drive circuit 200. Next, advantages thereof will be explained.

The switching voltage $V_{SW}$ at the dead time TD2 is a voltage corresponding to the reverse voltage $V_{REV}$ of the low-side transistor ML, similarly to the dead time TD1, but, a difference is that a gate-source voltage of the low-side transistor ML is 0 V at the dead time TD1, whereas the gate-source voltage of the low-side transistor ML is $V_{BIAS}$ at the dead time TD2. The reverse voltage $V_{REV}$ of the GaN-HEMT depends on the gate-source voltage, and when a positive voltage is applied between the gate and source, the reverse voltage $V_{REV}$ becomes smaller than when the gate-source voltage is 0 V. That is, a reverse voltage $V_{REV}'$ at the dead time TD2 is smaller than the reverse voltage $V_{REV}$ at the dead time TD1.

A power consumption P of the low-side transistor ML during the dead time is $$P = I \times V_{REV}$$

According to the present embodiment, since the reverse voltage $V_{REV}$ may be reduced during the dead time TD2, a loss in the low-side transistor ML may be reduced.

Figure 4:
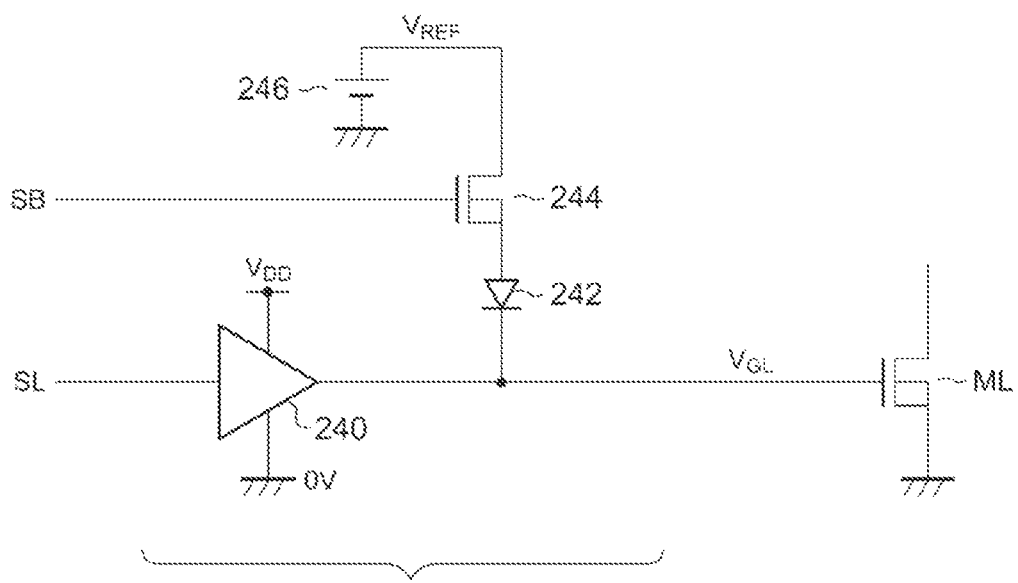
FIG. 4 is a circuit diagram showing a configuration example of a low-side driver.

FIG. 4 is a circuit diagram showing a configuration example of the low-side driver 204. The low-side driver 204 includes a pre-driver 240, a diode 242, a switch 244, and a voltage source 246.

The pre-driver 240 applies the high-level voltage $V_{DD}$ or the low-level voltage 0 V to the gate of the low-side transistor ML in response to the low-side pulse SL.

The voltage source 246 generates a reference voltage $V_{REF}$ that defines the bias voltage $V_{BIAS}$. The switch 244 is an NMOS transistor and receives the control signal SB at its gate. The switch 244 is turned on when the control signal SB is at a high level. The diode 242 is interposed between the switch 244 and the gate of the low-side transistor ML.

The pre-driver 240 may be configured by a three-state buffer. The pre-driver 240 may be disabled and its output may be high impedance between times t3 and t4 in FIG. 3.

When the switch 244 is turned on, the reference voltage $V_{REF}$ is supplied to the gate of the low-side transistor ML via the diode 242. When the forward voltage of the diode 242 is Vf, $V_{BIAS}=V_{REF}-Vf$. By interposing the diode 242, it is possible to prevent a current from flowing back from the gate of the low-side transistor ML to the voltage source 246 in the low-level output state $\varphi_L$ of FIG. 3.

The voltage source 246 may change the reference voltage $V_{REF}$ according to a temperature. The gate threshold voltage Vgs(th) of the low-side transistor ML has temperature dependence, and the threshold voltage Vgs(th) becomes lower as the temperature becomes higher. Therefore, by lowering the reference voltage $V_{REF}$ as the temperature increases, the reverse voltage during the dead time period may be appropriately controlled.

Further, the gate voltage of the low-side transistor ML is set to 0 V during the dead time TD1 inserted during the transition from the low-level output state $\varphi_L$ to the high-level output state $\varphi_H$. This may prevent the low-side transistor ML from self-turning on.

As shown in FIG. 3, prior to the dead time TD2, the bias voltage $V_{BIAS}$ begins to be applied between the gate and the source of the low-side transistor ML. In other words, since a timing when the bias voltage $V_{BIAS}$ starts to be applied only needs to be in the high-level output state, a fine timing control is not required for generation of the control signal SB.

Second Embodiment

Figure 5:
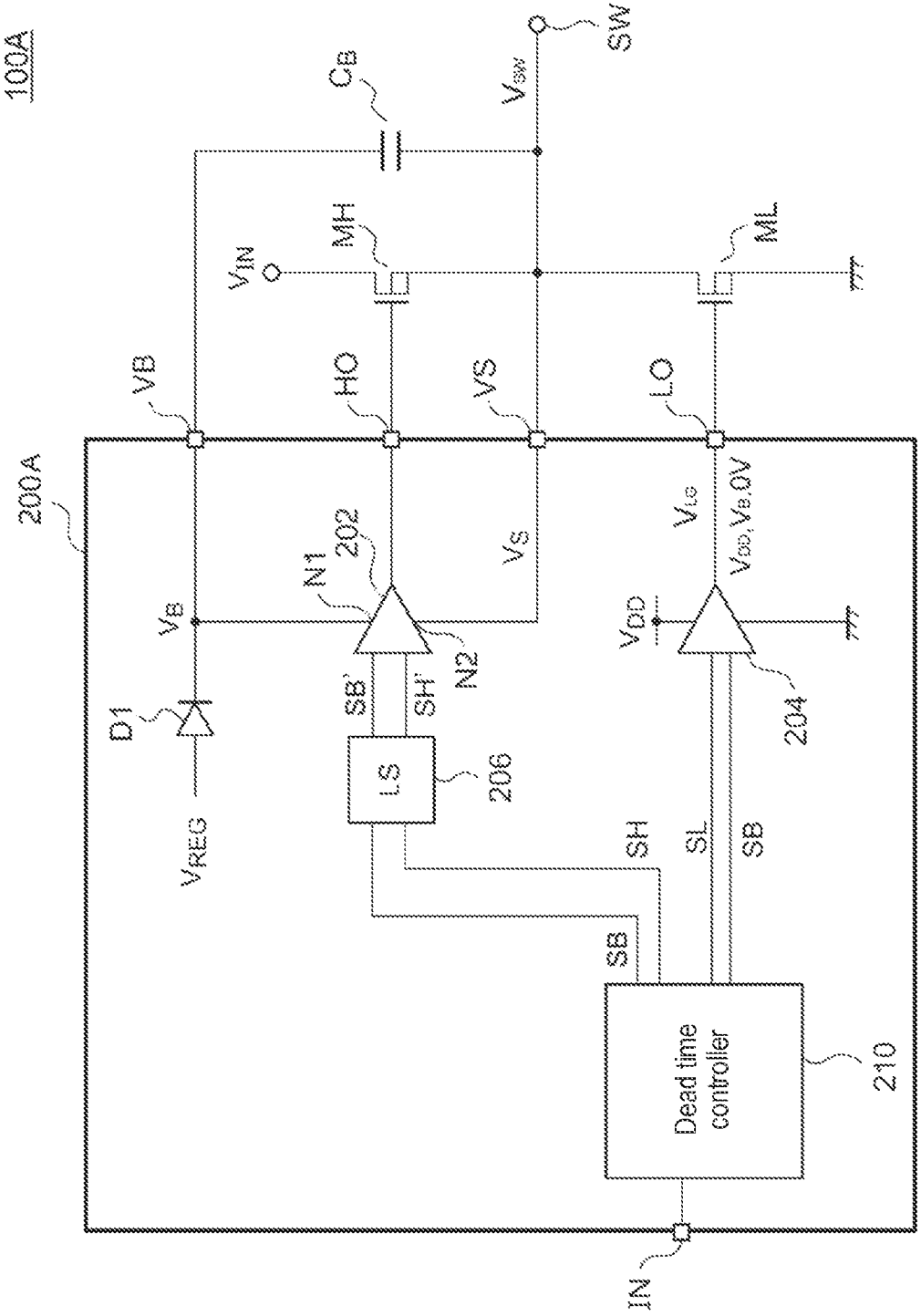
FIG. 5 is a block diagram of a switching circuit including a gate drive circuit according to a second embodiment of the present disclosure.

FIG. 5 is a block diagram of a switching circuit 100A including a gate drive circuit 200A according to a second embodiment of the present disclosure.

This switching circuit 100A operates in both a source mode in which a current flows out through the switching terminal SW and a sink mode in which a current is drawn from the outside through the switching terminal SW. When the switching circuit 100A operates in the sink mode, a reverse current flows through the high-side transistor MH during the dead times TD1 and TD2.

Therefore, in the gate drive circuit 200A, the high-side driver 202 is configured to be capable of applying three voltages, that is, a high-level voltage, a low-level voltage, and a bias voltage $V_{BIAS}$, between the gate and the source of the high-side transistor MH, similarly to the low-side driver 204.

Specifically, the high-side driver 202 applies the bias voltage $V_{BIAS}$ between the gate and the source of the high-side transistor MH during the dead time TD1 inserted during the transition from the low-level output state $\varphi_L$ to the high-level output state $\varphi_H$. In order to prevent self-turning on, 0 V is applied between the gate and the source of the high-side transistor MH during the dead time TD2.

According to the second embodiment, since the reverse voltage of the high-side transistor MH is reduced when operating in the sink mode, power consumption may be reduced.

Third Embodiment

In a third embodiment of the present disclosure, it is assumed that the switching circuit predominantly operates in the source mode and rarely operates in the sink mode. In this case, only the high-side driver 202 may be capable of outputting three voltages, a high-level voltage, a low-level voltage, and a bias voltage, and the low-side driver 204 may be capable of outputting two voltages, a high-level voltage and a low-level voltage.

Next, application of the switching circuit 100 will be explained.

Figure 6:
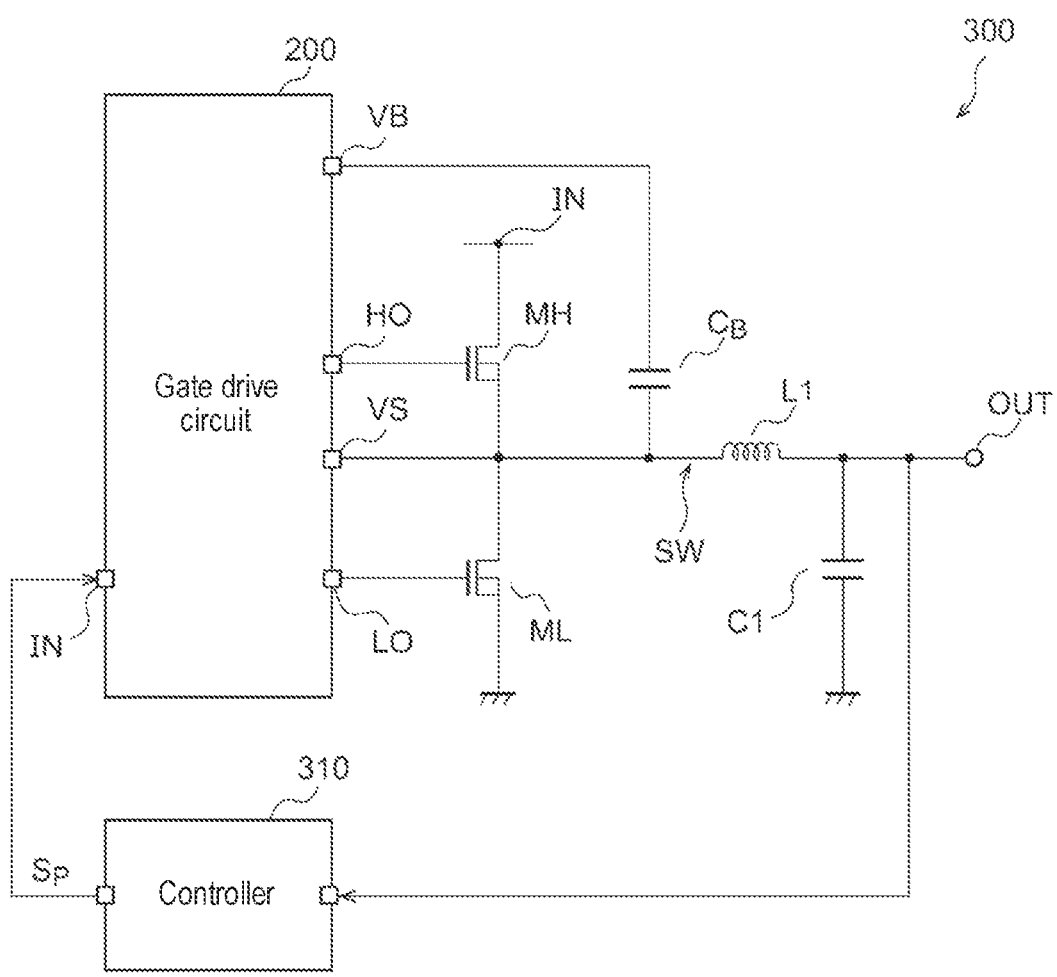
FIG. 6 is a circuit diagram of a DC/DC converter including a gate drive circuit.

FIG. 6 is a circuit diagram of a DC/DC converter 300 including the gate drive circuit 200. The DC/DC converter 300 is a step-down (buck) converter and includes an inductor L1, an output capacitor C1, and a controller 310 in addition to the gate drive circuit 200. The controller 310 is a pulse modulator configured to generate a pulse signal Sp modulated so that the output voltage or output current of the DC/DC converter 300 approaches a target state. The pulse signal Sp is supplied to the input terminal IN of the gate drive circuit 200.

The gate drive circuit 200, the high-side transistor MH, and the low-side transistor ML may be modularized within the same package. The controller 310 may be further modularized within this package.

Figure 7:
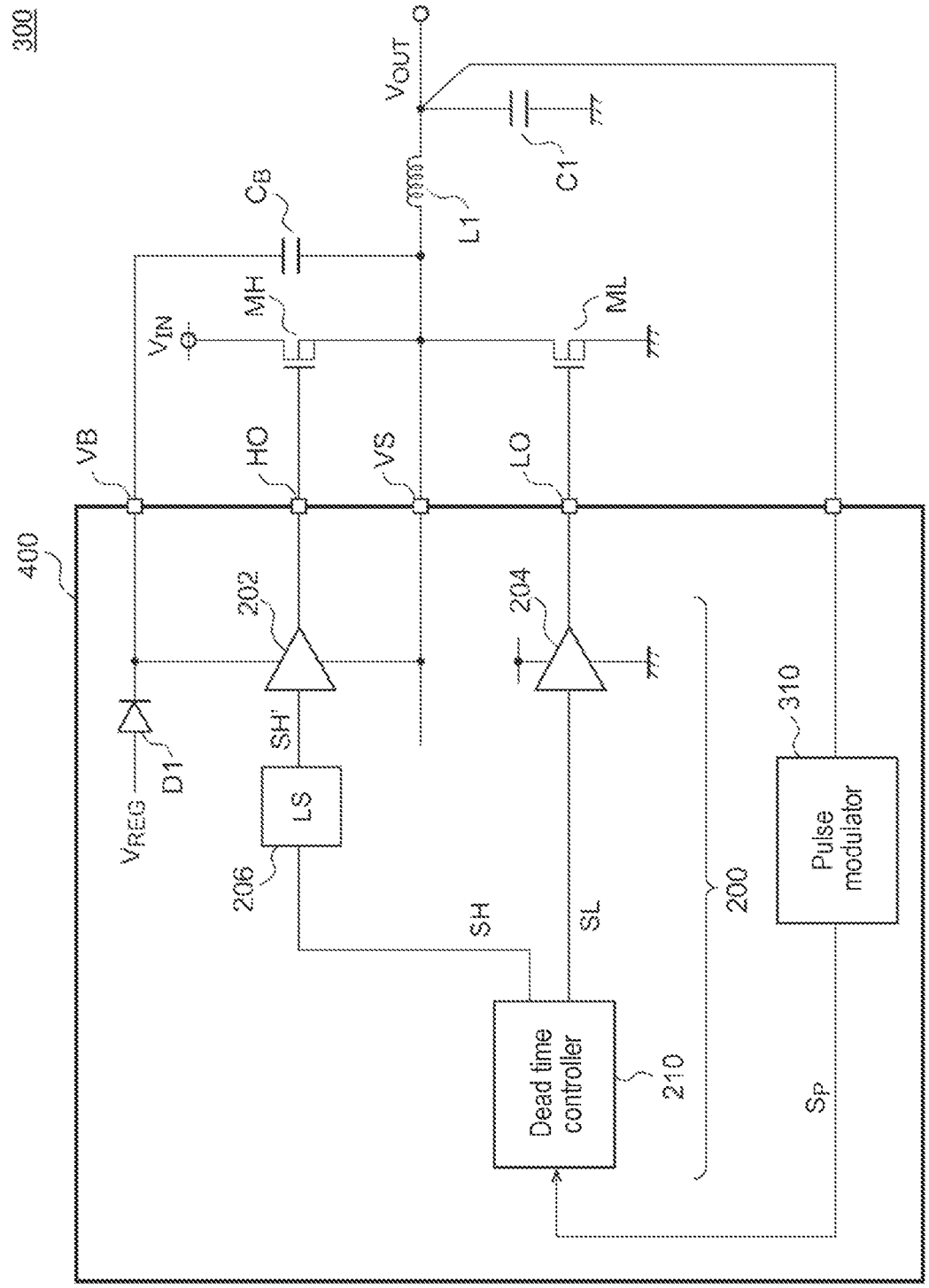
FIG. 7 is a circuit diagram of a DC/DC converter according to a modification.

FIG. 7 is a circuit diagram of a DC/DC converter 300 according to a modification. In the present modification, the controller 310 and the gate drive circuit 200 of FIG. 6 are integrated in the same IC (DC/DC converter control circuit) 400.

In the case of a digitally-controlled power supply, the pulse modulator may generate a duty cycle command value instead of the pulse signal Sp. The dead time controller 210 may generate the high-side pulse SH and the low-side pulse SL based on the duty cycle command value.

The DC/DC converter 300 may be a boost converter. In that case, a switching transistor is the low-side transistor ML, and a synchronous rectification transistor is the high-side transistor MH.

Although the embodiments according to the present disclosure have been described by using specific terms, such description is merely an example to aid understanding, and does not limit the present disclosure or the claims. The scope of the present disclosure is defined by the claims, and thus, embodiments, examples, and modifications not described herein are also included in the scope of the present disclosure.

The switching circuit is used in various applications such as motor drive circuits in addition to power supplies, and the present disclosure may be applied to applications other than power supplies.

Although the present disclosure has been described by using specific terms based on the embodiments, the embodiments merely illustrate the principles and applications of the present disclosure, and many modifications and rearrangement are recognized in the embodiments without departing from the spirit of the present disclosure defined in the claims.

SUPPLEMENTARY NOTES

The following supplementary notes are disclosed in the present disclosure.

Supplementary Note 1

A gate drive circuit for a switching circuit including a high-side transistor and a low-side transistor which are GaN-HEMTs (High Electron Mobility Transistors), including:
  a high-side driver configured to drive the high-side transistor; and
  a low-side driver configured to drive the low-side transistor,
  wherein the low-side driver is further configured to be capable of applying 0 V, a high-level voltage higher than a gate threshold voltage of the low-side transistor, and a bias voltage lower than the gate threshold voltage between a gate and a source of the low-side transistor, and wherein the low-side driver is further configured to apply the bias voltage between the gate and the source of the low-side transistor during a dead time inserted during transition from a high-level output state in which the high-side transistor is turned on and the low-side transistor is turned off to a low-level output state in which the high-side transistor is turned off and the low-side transistor is turned on.

Supplementary Note 2

The gate drive circuit of Supplementary Note 1, wherein the low-side driver is further configured to start applying the bias voltage before transition from the high-level output state to the dead time.

Supplementary Note 3

The gate drive circuit of Supplementary Note 1 or 2, wherein the low-side driver includes:
a pre-driver configured to apply the high-level voltage or a low-level voltage to the gate of the low-side transistor;
a voltage source configured to generate a reference voltage that defines the bias voltage; and
a switch connected between an output of the voltage source and the gate of the low-side transistor.

Supplementary Note 4

The gate drive circuit of Supplementary Note 3, wherein the voltage source is further configured to change the reference voltage according to a temperature.

Supplementary Note 5

The gate drive circuit of any one of Supplementary Notes 1 to 4, wherein the 0 V are applied between the gate and the source of the low-side transistor during a dead time inserted during transition from the low-level output state to the high-level output state.

Supplementary Note 6

The gate drive circuit of any one of Supplementary Notes 1 to 5, wherein the high-side driver is further configured to be capable of applying 0 V, a high-level voltage higher than a gate threshold voltage of the high-side transistor, and a bias voltage lower than the gate threshold voltage between a gate and a source of the high-side transistor, and
wherein the high-side driver is further configured to apply the bias voltage between the gate and the source of the high-side transistor during a dead time inserted during transition from the low-level output state to the high-level output state.

Supplementary Note 7

A gate drive circuit for a switching circuit including a high-side transistor and a low-side transistor which are GaN-HEMTs (High Electron Mobility Transistors), including:

a high-side driver configured to drive the high-side transistor; and
a low-side driver configured to drive the low-side transistor,
wherein the high-side driver is further configured to be capable of applying 0 V, a high-level voltage higher than a gate threshold voltage of the high-side transistor, and a bias voltage lower than the gate threshold voltage between a gate and a source of the high-side transistor, and
wherein the high-side driver is further configured to apply the bias voltage between the gate and the source of the high-side transistor during a dead time inserted during transition from a low-level output state in which the high-side transistor is turned off and the low-side transistor is turned on to a high-level output state in which the high-side transistor is turned on and the low-side transistor is turned off.

Supplementary Note 8

The gate drive circuit of any one of Supplementary Notes 1 to 7, wherein the gate drive circuit is integrated on one semiconductor substrate.

Supplementary Note 9

A module including:
the gate drive circuit of any one of Supplementary Notes 1 to 8;
the high-side transistor; and
the low-side transistor.

Supplementary Note 10

A switching power supply including:
a high-side transistor and a low-side transistor; and
the gate drive circuit of any one of Supplementary Notes 1 to 8, configured to drive the high-side transistor and the low-side transistor.

According to the present disclosure in some embodiments, it is possible to reduce a loss during a dead time.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A gate drive circuit for a switching circuit including a high-side transistor and a low-side transistor which are GaN-HEMTs (High Electron Mobility Transistors), comprising:
a high-side driver configured to drive the high-side transistor; and
a low-side driver configured to drive the low-side transistor, based on a low-side pulse and a control signal,
wherein the low-side driver is further configured to be capable of applying 0 V, a high-level voltage higher than a gate threshold voltage of the low-side transistor, and a bias voltage lower than the gate threshold voltage and higher than 0 V between a gate and a source of the low-side transistor,
wherein the low-side driver is further configured to apply the bias voltage between the gate and the source of the low-side transistor during a dead time inserted during transition from a high-level output state in which the high-side transistor is turned on and the low-side transistor is turned off to a low-level output state in which the high-side transistor is turned off and the low-side transistor is turned on, and
wherein the low-side driver is further configured to start applying the bias voltage before transition from the high-level output state to the dead time by transitioning the control signal from 0 V to a high level voltage.

2. The gate drive circuit of claim 1, wherein the low-side driver includes:
a pre-driver configured to apply the high-level voltage or a low-level voltage to the gate of the low-side transistor, based on the low-side pulse;
a voltage source configured to generate a reference voltage that defines the bias voltage; and
a switch connected between an output of the voltage source and the gate of the low-side transistor,
wherein the switch is configured to be controlled based on the control signal.

3. The gate drive circuit of claim 2, wherein the voltage source is further configured to change the reference voltage according to a temperature.

4. The gate drive circuit of claim 1, wherein 0 V is applied between the gate and the source of the low-side transistor during a dead time inserted during transition from the low-level output state to the high-level output state.

5. The gate drive circuit of claim 1, wherein the high-side driver is further configured to be capable of applying 0 V, a high-level voltage higher than a gate threshold voltage of the high-side transistor, and a bias voltage lower than the gate threshold voltage of the high-side transistor between a gate and a source of the high-side transistor, and
wherein the high-side driver is further configured to apply the bias voltage between the gate and the source of the high-side transistor during a dead time inserted during transition from the low-level output state to the high-level output state.

6. The gate drive circuit of claim 1, wherein the gate drive circuit is integrated on one semiconductor substrate.

7. A module comprising:
the gate drive circuit of claim 1;
the high-side transistor of claim 1; and
the low-side transistor of claim 1.

8. A switching power supply comprising:
the high-side transistor of claim 1 and the low-side transistor of claim 1; and
the gate drive circuit of claim 1, configured to drive the high-side transistor and the low-side transistor.

9. The gate drive circuit of claim 2, wherein the low-side driver further includes a diode connected between the switch and the gate of the low-side transistor.

10. A gate drive circuit for a switching circuit including a high-side transistor and a low-side transistor which are GaN-HEMTs (High Electron Mobility Transistors), comprising:
a dead time controller configured to generate a high-side pulse, a high-side control signal, a low-side pulse, and a low-side control signal,
a high-side driver configured to drive the high-side transistor, based on the high-side pulse and the high-side control signal; and
a low-side driver configured to drive the low-side transistor, based on the low-side pulse and the low-side control signal,
wherein the high-side driver is further configured to be capable of applying 0 V, a high-level voltage higher than a gate threshold voltage of the high-side transistor, and a first bias voltage lower than the gate threshold voltage between a gate and a source of the high-side transistor,
wherein the high-side driver is further configured to apply the first bias voltage between the gate and the source of the high-side transistor during a first dead time inserted during transition from a low-level output state in which the high-side transistor is turned off and the low-side transistor is turned on to a high-level output state in which the high-side transistor is turned on and the low-side transistor is turned off,
wherein the low-side driver is further configured to be capable of applying 0 V, a high-level voltage higher than a gate threshold voltage of the low-side transistor, and a second bias voltage lower than the gate threshold voltage and higher than 0V between a gate and a source of the low-side transistor,
wherein the low-side driver is further configured to apply the second bias voltage between the gate and the source of the low-side transistor during a second dead time inserted during transition from the high-level output state to the low-level output state, and
wherein the low-side driver is further configured to start applying the second bias voltage before transition from the high-level output state to the second dead time by transitioning the low-side control signal from 0 V to a high level voltage.

* * * * *